United States Patent
Morozov et al.

(10) Patent No.: US 11,595,131 B1
(45) Date of Patent: Feb. 28, 2023

(54) INTEGRATION OF PASSIVE MICROWAVE STOP-BAND FILTER INTO A RADIO FREQUENCY (RF) INTERCONNECT PRINTED CIRCUIT BOARD FOR OPTO-ELECTRONIC MODULE RF BANDWIDTH CONTROL

(71) Applicant: Lumentum Operations LLC, San Jose, CA (US)

(72) Inventors: Nikolai Morozov, San Jose, CA (US); Zhong Pan, San Jose, CA (US); Joe Qingzhe Wen, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 17/449,605

(22) Filed: Sep. 30, 2021

Related U.S. Application Data

(60) Provisional application No. 63/260,172, filed on Aug. 11, 2021.

(51) Int. Cl.
| | |
|---|---|
| *H04B 10/00* | (2013.01) |
| *H04B 10/61* | (2013.01) |
| *H04B 10/80* | (2013.01) |
| *H05K 1/02* | (2006.01) |
| *H05K 1/11* | (2006.01) |

(52) U.S. Cl.
CPC ......... *H04B 10/616* (2013.01); *H04B 10/803* (2013.01); *H05K 1/0251* (2013.01); *H05K 1/118* (2013.01)

(58) Field of Classification Search
CPC .. H04B 10/40; H04B 10/616; H04B 10/2507; H04B 10/25753; H04B 10/25752; G02B 6/4246; G02B 6/4215; G02B 6/4261; G02B 6/4281; H05K 1/148; H05K 1/144
USPC ....... 398/135, 136, 137, 138, 139, 164, 158, 398/159, 182, 183, 186, 187, 202, 208, 398/209, 115, 116, 117; 385/88, 89, 90, 385/92, 93
See application file for complete search history.

(56) References Cited

U.S. PATENT DOCUMENTS

| | | | | |
|---|---|---|---|---|
| 7,417,517 B2 * | 8/2008 | Hernandez | .............. | H01P 1/203 333/204 |
| 8,380,073 B2 * | 2/2013 | Edwards | .............. | G02B 6/4201 398/164 |
| 10,989,870 B2 * | 4/2021 | Lin | ...................... | G02B 6/4254 |

* cited by examiner

*Primary Examiner* — Hanh Phan
(74) *Attorney, Agent, or Firm* — Harrity & Harrity, LLP

(57) ABSTRACT

An optical device may include an optical subassembly and a digital signal processor (DSP). The optical device may include a radio frequency (RF) interconnect that electrically connects the optical subassembly and the DSP. The optical device may include a passive RF filter on one or more transmission lines of the RF interconnect.

20 Claims, 7 Drawing Sheets

100

INTEGRATION OF PASSIVE MICROWAVE STOP-BAND FILTER INTO A RADIO FREQUENCY (RF) INTERCONNECT PRINTED CIRCUIT BOARD FOR OPTO-ELECTRONIC MODULE RF BANDWIDTH CONTROL

CROSS-REFERENCE TO RELATED APPLICATION

This Patent application claims priority to U.S. Provisional Patent Application No. 63/260,172, filed on Aug. 11, 2021, and entitled "INTEGRATION OF PASSIVE MICROWAVE STOP-BAND FILTER INTO RADIO FREQUENCY INTERCONNECT PRINTED CIRCUIT BOARD FOR OPTO-ELECTRONIC MODULE SPECTRUM CONTROL." The disclosure of the prior Application is considered part of and is incorporated by reference into this Patent Application.

TECHNICAL FIELD

The present disclosure relates generally to radio frequency (RF) bandwidth control of for an opto-electronic module and, more particularly, to integration of a passive RF filter on an RF interconnect in order to enable RF bandwidth control of for an opto-electronic module.

BACKGROUND

Formats used for data transmission may vary among telecommunication systems, or even within a particular telecommunication system. Such formats include, for example, dual polarization quadrature phase shift keying (DP-QPSK), 8 quadrature amplitude modulation (8QAM), or 16 quadrature amplitude modulation (16QAM), or the like. Each format has a specific algorithm of modulation, and may be implemented with a different clock rate, a different sampling rate, and/or a different optical channel spacing. Many formats utilize phase-amplitude modulation with coherent detection. Both modulation and demodulation are performed digitally using, for example, an ultra-fast specialized digital signal processor (DSP). There is a demand to increase baud rate and optical channel spacing density in order to increase overall network bandwidth. Ideally, a given transmitter-receiver optical subassembly (TROSA) would be used for each possible network configuration. However, designing such a TROSA is impractical and, therefore, broad bandwidth TROSAs typically need to be accommodated in different networks and used for different formats.

SUMMARY

In some implementations, an optical device includes an optical subassembly; a DSP; a radio frequency (RF) interconnect that electrically connects the optical subassembly and the DSP; and a passive RF filter on one or more transmission lines of the RF interconnect.

In some implementations, an opto-electronic module includes an optical subassembly; a DSP; an RF interconnect connecting the optical subassembly and the DSP; and a passive RF filter on a set of transmission lines of the RF interconnect to provide spectrum control of the opto-electronic module.

In some implementations, a system includes an optical device including: an optical subassembly; a DSP; and an RF interconnect connecting the optical subassembly and the DSP, the RF interconnect comprising: a set of transmission lines, and a passive RF filter on one or more transmission lines of the set of transmission lines.

DETAILED DESCRIPTION

Figure 1:
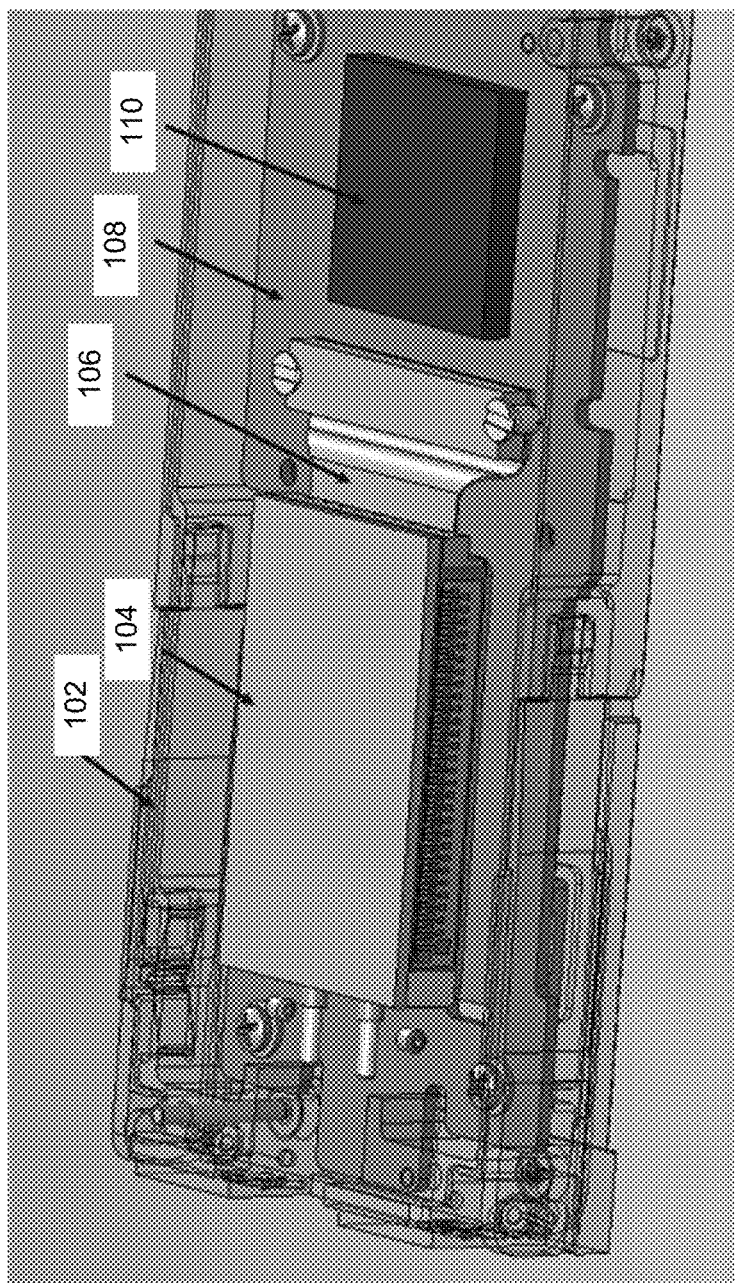
FIG. 1 is a diagram of an example opto-electronic module as described herein.

The following detailed description of example implementations refers to the accompanying drawings. The same reference numbers in different drawings may identify the same or similar elements.

Utilizing a broad bandwidth TROSA in an optical network is challenging due to the problem of multichannel cross-talk. Because of the digital nature of modulation, a transmitted optical signal, in addition to a baseband spectral maximum located around an optical carrier frequency, includes parasitic peaks (referred to as side lobes) that are shifted to higher and lower frequencies. The amount of shift depends on a ratio between a modulation rate and a sampling rate. If an RF bandwidth of electronics of the optical transmitter is wider than optimal, it is possible for parasitic side lobes to pass through and be transmitted into an optical network. If optical channel spacing is tight, these parasitic lobes can interfere with the signal of a neighboring optical channel, thereby degrading quality of the optical network. The same concern applies to an optical receiver—if the RF bandwidth of the optical receiver is wider than optimal, the optical receiver is affected by excessive multi-channel crosstalk, resulting in degradation of optical network performance. Therefore, ensuring that an optical transmitter and an optical receiver have an RF bandwidth that is accurately tuned is important to a particular network operation mode.

There are a number of techniques for providing bandwidth correction at an optical transmitter/receiver, such as (1) performing filtering in an optical path, (2) performing digital filtering at a DSP, (3) performing bandwidth control inside of a chip set of an optical subassembly (e.g., a TROSA, a receiver optical subassembly (ROSA), or a transmitter optical subassembly (TOSA)), or (4) performing passive filtering in an RF interface between the DSP and the optical subassembly. Techniques (1)-(3) are utilized in different networks, but have limitations. With respect to technique (1), filtering in the optical path is incompatible with a colorless optical network architecture and, therefore, cannot be used in some optical networks. With respect to technique (2), digital filtering needs to be implemented in DSP, which can increase cost or complexity of the DSP. Further, digital filtering can result in a significant increase in power consumption. With respect technique (3), bandwidth control implemented in the optical subassembly does not typically provide enough filtering capability, and therefore needs to be supplemented with some other type of filtering. Technique (4)—a passive filter in the RF interface—overcomes the limitations of techniques (1)-(3).

Some implementations described herein provide a passive resonance RF filter (herein referred to as a passive RF filter) that is integrated into an RF interconnect (e.g., on a printed circuit board (PCB)) of an opto-electronic module in order to enable spectrum control of the opto-electronic module. In some implementations, the passive RF filter can be utilized in an opto-electronic module including a broad bandwidth optical subassembly (e.g., a TROSA, a TOSA, or a ROSA—described below) to provide bandwidth control (e.g., for the purpose of cross-talk suppression). In some implementations, the integration of the passive RF filter provides a simple, reliable, and cost-effective technique for improving bandwidth control that allows a single broad-bandwidth optical assembly to be utilized with different optical networks or in conjunction with different data transmission formats.

FIG. 1 is a diagram of an example opto-electronic module 100. As shown in FIG. 1, the opto-electronic module 100 includes a housing 102, an optical subassembly 104, an RF interconnect 106, a PCB 108, and a DSP 110.

The housing 102 is a mechanical enclosure that houses components of the opto-electronic module 100, such as the optical subassembly 104, the RF interconnect 106, the PCB 108, the DSP 110, or one or more other components of the opto-electronic module 100.

The optical subassembly 104 is a component configured to convert an electrical signal (e.g., an electrical current) to an optical signal and/or to convert an optical signal to an electrical signal. In some implementations, the optical subassembly 104 includes one or more components configured to convert an electrical signal (e.g., an output signal of the DSP 110) to an optical signal (e.g., to enable the optical signal to be transmitted in an optical network). Additionally, or alternatively, the optical subassembly 104 may include one or more components configured to convert an optical signal (e.g., received from the optical network) to an electrical signal (e.g., to enable the electrical signal to be provided to the DSP 110 for processing). An optical subassembly 104 capable of converting electrical signals to optical signals and converting optical signals to electrical signals is referred to as a transmitter-receiver optical subassembly (TROSA). An optical subassembly 104 capable of converting only electrical signals to optical signals is referred to as a transmitter optical subassembly (TOSA). An optical subassembly 104 capable of converting only optical signals to electrical signals is referred to as a receiver optical subassembly (ROSA). In some implementations, the optical subassembly 104 may comprise a TROSA, a TOSA, or a ROSA.

The RF interconnect 106 is a component that electrically connects the optical subassembly 104 and the DSP 110 (e.g., via the PCB 108) such that the optical subassembly 104 can provide an electrical signal to the DSP 110 or receive an electrical signal from the DSP 110. In some implementations, as illustrated in the example opto-electronic module 100 shown in FIG. 1, the RF interconnect 106 may be provided on a flexible PCB (FPCB). In some implementations, the RF interconnect 106 may be provided on the PCB 108 (e.g., the RF interconnect 106 can be integrated on or in the PCB 108). In some implementations, one or more passive RF filters associated with controlling a bandwidth of the opto-electronic module 100 can be formed on the RF interconnect 106, as described below with respect to FIGS. 2A-2C.

The PCB 108 is a main PCB of the opto-electronic module 100. For example, the PCB 108 may be a PCB on which one or more other components of the opto-electronic module 100 are mounted and/or via which one or more components of the opto-electronic module 100 are electrically connected. For example, the optical subassembly 104 may be electrically connected to the DSP 110 via the PCB 108 (and the RF interconnect 106).

The DSP 110 is a digital signal processing device or a collection of digital signal processing devices. In some implementations, the DSP 110 may receive digital signals from another component of opto-electronic module 100 or a component external to opto-electronic module 100 and may process the digital signals to form output signals destined for optical subassembly 104. For example, when opto-electronic module 100 is configured to transmit an optical signal (e.g., when the optical subassembly 104 is a TROSA or a TOSA), the DSP 110 may receive a digital signal; perform encoding, modulation or one or more other signal processing tasks; and provide an output signal to the optical subassembly 104. In some implementations, the DSP 110 may receive analog or digital signals from optical subassembly 104 and may process the analog or digital signals to form output signals destined for another component of opto-electronic module 100 or a component external to opto-electronic module 100. For example, when opto-electronic module 100 is configured to receive an optical signal (e.g., when the optical subassembly 104 is a TROSA or a ROSA), the DSP 110 may receive an analog or digital signal from the optical subassembly 104, perform demodulation or one or more other processing tasks, and provide an output signal to another component of opto-electronic module 100 or to a component external to opto-electronic module 100.

As indicated above, FIG. 1 is provided as an example. Other examples may differ from what is described with regard to FIG. 1. The number and arrangement of components shown in FIG. 1 are provided as an example. In practice, there may be additional components, fewer components, different components, or differently arranged components than those shown in FIG. 1. Furthermore, two or more components shown in FIG. 1 may be implemented within a single component, or a single component shown in FIG. 1 may be implemented as multiple, distributed components. Additionally, or alternatively, a set of components (e.g., one or more components) shown in FIG. 1 may perform one or more functions described as being performed by another set of components shown in FIG. 1.

Figure 2A:
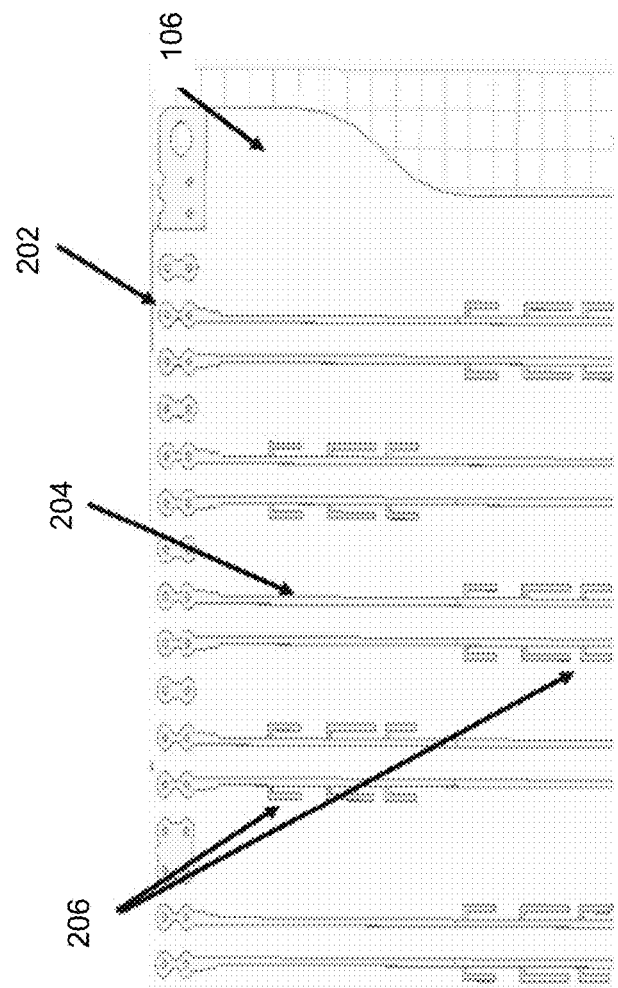
FIGS. 2A-2C are diagrams of example implementations of passive RF filters integrated on an RF interconnect, as described herein.
Figure 2B:
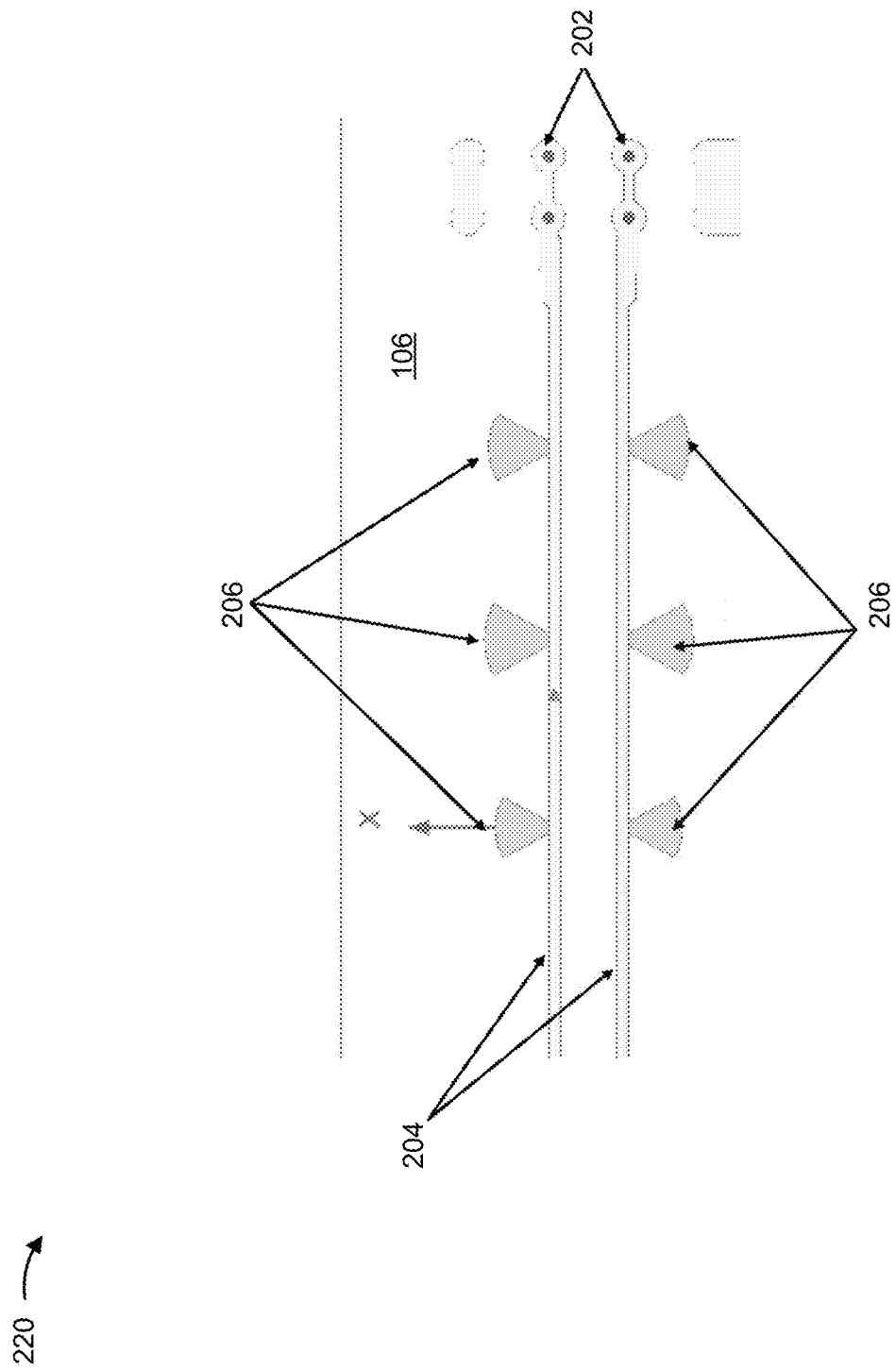
Figure 2C:
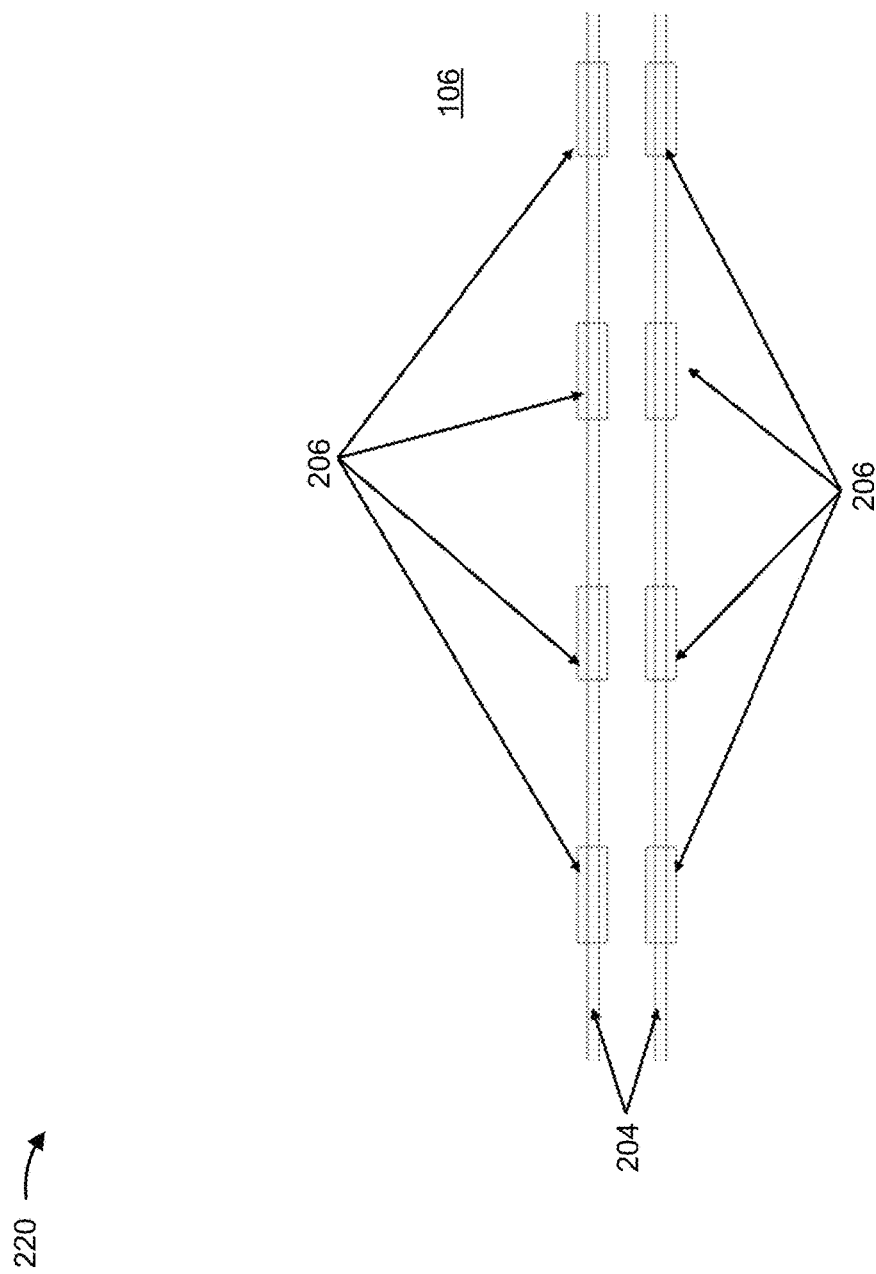

FIGS. 2A-2C are diagrams of example implementations of passive RF filters integrated on an RF interconnect 106 of an opto-electronic module 100, as described herein. As shown in FIGS. 2A-2C, the RF interconnect 106 may include a set of solder pads 202, a set of transmission lines 204, and a set of passive RF filters 206.

A solder pad 202 is a component that enables attachment of the RF interconnect 106 to the optical subassembly 104. In some implementations, a solder pad 220 facilitates an electrical connection between the RF interconnect 106 (e.g., a transmission line 204 of the RF interconnect 106) and the optical subassembly 104. In some implementations, a solder pad 202 may be a thru-hole pad or a surface mount pad.

A transmission line 204 is a component associated with transmitting electrical signals on the RF interconnect 106. For example, a transmission line 204 may be an RF trace used in association with transmitting an electrical signal, provided by the DSP 110, on the RF interconnect 106 to enable the electrical signal to be provided to the optical subassembly 104. As another example, a transmission line 204 may be used in association with transmitting an electrical signal, provided by the optical subassembly 104, on the RF interconnect 106 to enable the electrical signal to be provided to the DSP 110. In some implementations, the RF interconnect 106 may include one or more transmission lines 204 associated with electrically connecting an output of the DSP 110 to an input of the optical subassembly 104 (e.g., when the optical subassembly 104 is a TOSA or a TROSA). In some implementations, the RF interconnect 106 may include one or more transmission lines 204 associated with electrically connecting an output of the optical subassembly 104 to an input of the DSP 110 (e.g., when the optical subassembly 104 is a ROSA or a TROSA). In some implementations, a passive RF filter 206 may be formed on one or more transmission lines 204, as described herein.

A passive RF filter 206 includes a filter structure for providing bandwidth control of opto-electronic module 100. For example, in some implementations, the passive RF filter may be a Stop-Band filter, a Low Frequency Pass filter (e.g., a Stop-Band filter with a high cut-off frequency $f_H=\infty$), or may be another type of passive RF filter. In some implementations, the passive RF filter 206 is integrated into opto-electronic module 100. For example, as illustrated in FIGS. 2A-2C, a passive RF filter 206 may be formed on a transmission line 204 of the RF interconnect 106 that connects the optical subassembly 104 to the DSP 110 within the opto-electronic module 100.

In some implementations, the passive RF filter 206 enables control of an RF bandwidth of the optical subassembly 104. For example, in the case of an optical transmitter (e.g., an opto-electronic module 100 comprising an optical subassembly 104 configured to transmit an optical signal, such as a TOSA or a TROSA), the passive RF filter 206 may control an RF bandwidth such that an impact of side lobes resulting from digital modulation performed by the DSP 110 on an optical signal transmitted by the optical subassembly 104 is reduced or minimized. As another example, in the case of an optical receiver (e.g., an opto-electronic module 100 comprising an optical subassembly 104 configured to receive an optical signal, such as a ROSA or a TROSA) the passive RF filter 206 may control an RF bandwidth such that an impact of neighboring optical channels on an electrical signal generated by the optical subassembly 104 is reduced or minimized.

In some implementations, the passive RF filter 206 can be implemented as a passive structure on the transmission line 204. In some implementations, the passive structure may include one or more open-stab resonators, examples of which are shown on various transmission lines 204 in FIG. 2A. Additionally, or alternatively, the one or more passive structures may include one or more radial stab resonators, examples of which are shown in FIG. 2B. Additionally, or alternatively, the one or more passive structures may include one or more impedance-variation resonators (e.g., one or more grating structures), examples of which are shown in FIG. 2C. Notably, these types of passive structures are provided for illustrative purposes, and the passive RF filter 206 may in some implementations include one or more other types of passive structures or a combination of two or more different types of passive structures. In some implementations, active trim of elements of the passive RF filter 206 (e.g., active trim of resonator stabs of the passive RF filter 206) can be used to improve accuracy of filtering provided by the passive RF filter 206.

In some implementations, a characteristic of the passive RF filter 206 may be selected or designed so as to provide a desired cut-off frequency or stop-band for a given application. For example, a shape of a given passive RF filter 206, a location of the given passive RF filter 206 on a corresponding transmission line 204, or a location of the given passive RF filter 206 relative to another passive RF filter 206 may be selected or designed so as to provide a desired cut-off frequency or stop-band for a given application. In some implementations, a characteristic of the passive RF filter 206 may be selected or designed based on characteristics of the opto-electronic module 100 or based on characteristics of one or more other components of the opto-electronic module 100. That is, one or more characteristics of the passive RF filter 206 can in some implementations be selected or designed based on the characteristics of the opto-electronic module 100 or based on characteristics of one or more other components of the opto-electronic module 100.

In some implementations, the passive RF filter 206 may be located on the RF interconnect 106 between the optical subassembly 104 and the DSP 110. For example, the passive RF filter 206 may be located on a transmission line 204 of the RF interconnect 106 (e.g., on an RF interconnect PCB, on an FPCB, or the like) between the optical subassembly 104 and the DSP 110. As another example, the passive RF filter 206 may be located on the PCB 108 between the optical subassembly 104 and the DSP 110 (e.g., when the RF interconnect 106 is provided on the PCB 108). In some implementations, when the passive RF filter 206 is located on the PCB 108, the passive RF filter 206 may be constructed using one or more surface-mount technology (SMT) components.

As indicated above, FIGS. 2A-2C are provided as examples. Other examples may differ from what is described with regard to FIGS. 2A-2C. The number and arrangement of components shown in FIGS. 2A-2C are provided as an example. In practice, there may be additional components, fewer components, different components, or differently arranged components than those shown in FIGS. 2A-2C. Furthermore, two or more components shown in FIGS. 2A-2C may be implemented within a single component, or a single component shown in FIGS. 2A-2C may be implemented as multiple, distributed components. Additionally, or alternatively, a set of components (e.g., one or more components) shown in FIGS. 2A-2C may perform one or more functions described as being performed by another set of components shown in FIGS. 2A-2C.

Figure 3:
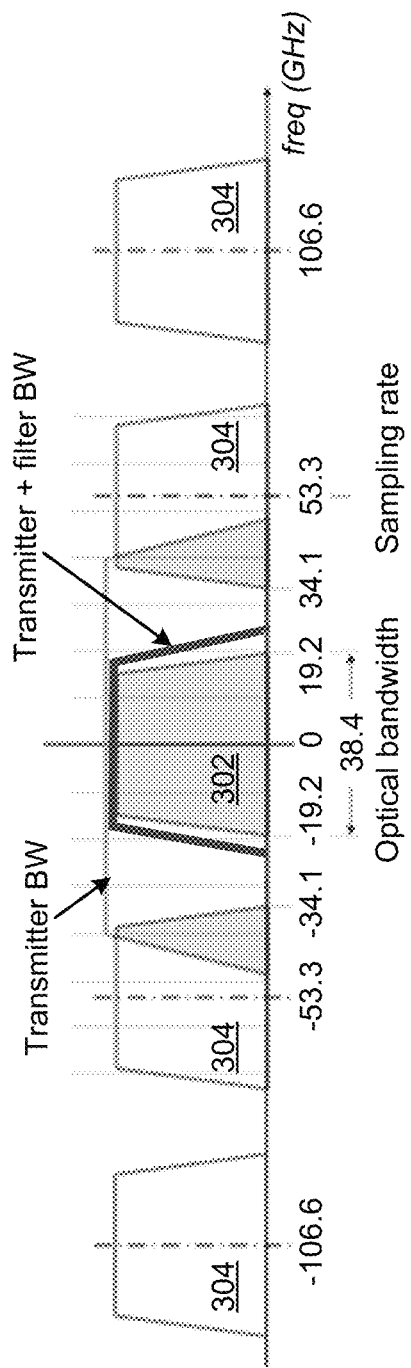
FIGS. 3 and 4 are diagrams illustrating examples of spectrums associated with an optical transmitter and an optical receiver, respectively.
Figure 4:
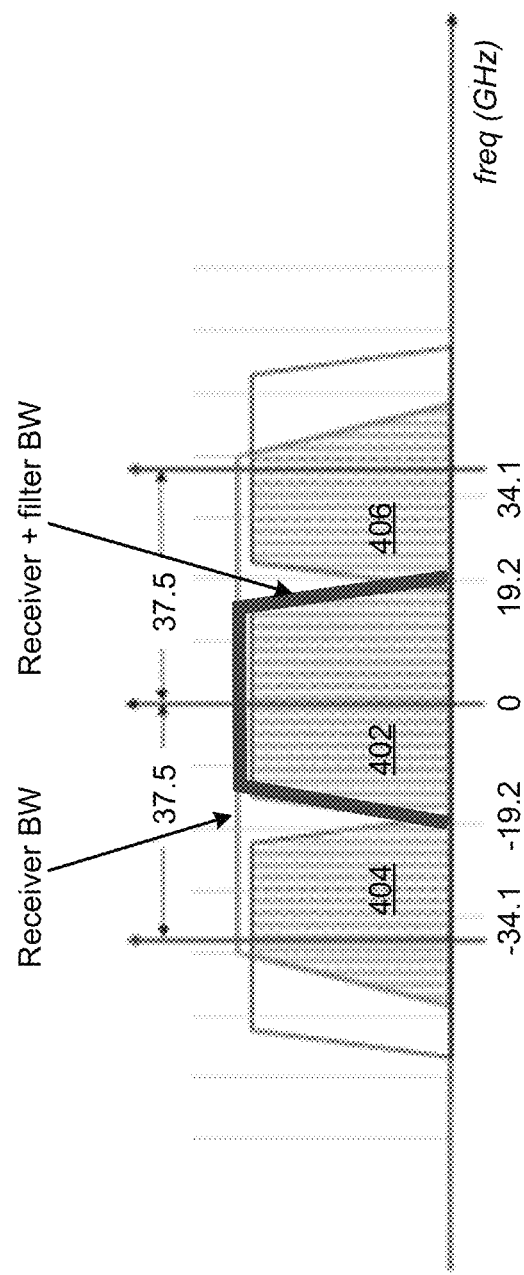

FIGS. 3 and 4 are diagrams illustrating examples of spectrums associated with an optical transmitter and an optical receiver, respectively.

With respect to FIG. 3, after digital modulation and conversion of the modulated signal to an optical signal, an opto-electronic module may transmit the optical signal on an optical network. As illustrated in FIG. 3, as a result of the digital modulation, energy is spread around a central optical frequency in the optical signal so that a central optical channel 302 represents the modulated signal. However, as shown in FIG. 3, due to the nature of the digital modulation, additional modulated spectrums 304 (referred to as side lobes 304) are generated, with a frequency shift that depends on a modulation mode. Notably, intensity of the side lobes 304 may become weaker further from the central frequency, but side lobes 304 nearest to the central optical channel 302 may have an intensity near that of the central optical channel 302.

Without filtering, a bandwidth of an optical transmitter may cause an opto-electronic module to transmit partial energy from the side lobes 304, as indicated by the line labeled "Transmitter BW" in FIG. 3. In such a case, the side lobes 304 may be in a same spectrum as another optical signal (e.g., transmitted by another optical transmitter in the optical network), which results in cross-talk at an optical receiver that receives the optical signals. However, in the case of the opto-electronic module 100 comprising the passive RF filter 206 integrated on the RF interconnect 106, the passive RF filter 206 may limit the bandwidth of the optical transmitter, as indicated by the line labeled "Transmitter+filter BW" in FIG. 3. Here, filtering provided by the passive RF filter 206 may prevent the side lobes 304 from being transmitted in the optical network, thereby reducing or eliminating cross-talk at the optical receiver and improving performance of the optical network.

With respect to FIG. 4, optical channel spacing in an optical network may cause optical channels to be close to (or even partially overlap) one another on the optical spectrum. For example, as shown in FIG. 4, an optical spacing may be such that an optical channel 402 is between an optical channel 404 and an optical channel 406. Generally, dense optical channel spacing is utilized to increase an amount of data that can be carried on the optical network. However, in such a scenario, a bandwidth of an optical receiver should be small enough such that the optical receiver receives only a desired channel despite the dense channel spacing.

Taking FIG. 4 as an example, without filtering (and even in the case of an ideal optical transmitter), a bandwidth of an optical receiver may cause an opto-electronic module to generate an output based on optical channel 402, optical channel 404, and optical channel 406, as indicated by the line labeled "Receiver BW" in FIG. 4. In such a case, the optical channel 404 and the optical channel 406 cause cross-talk at the optical receiver. However, in the case of the opto-electronic module 100 comprising the passive RF filter 206 integrated on the RF interconnect 106, the passive RF filter 206 may limit the bandwidth of the optical receiver, as indicated by the line labeled "Receiver+filter BW" in FIG. 4. Here, filtering provided by the passive RF filter 206 may cause the opto-electronic module 100 to generate an output based on only optical channel 402, thereby reducing cross-talk and improving performance of the optical network.

As indicated above, FIGS. 3 and 4 are provided as examples. Other examples may differ from what is described with regards to FIGS. 3 and 4.

Figure 5:
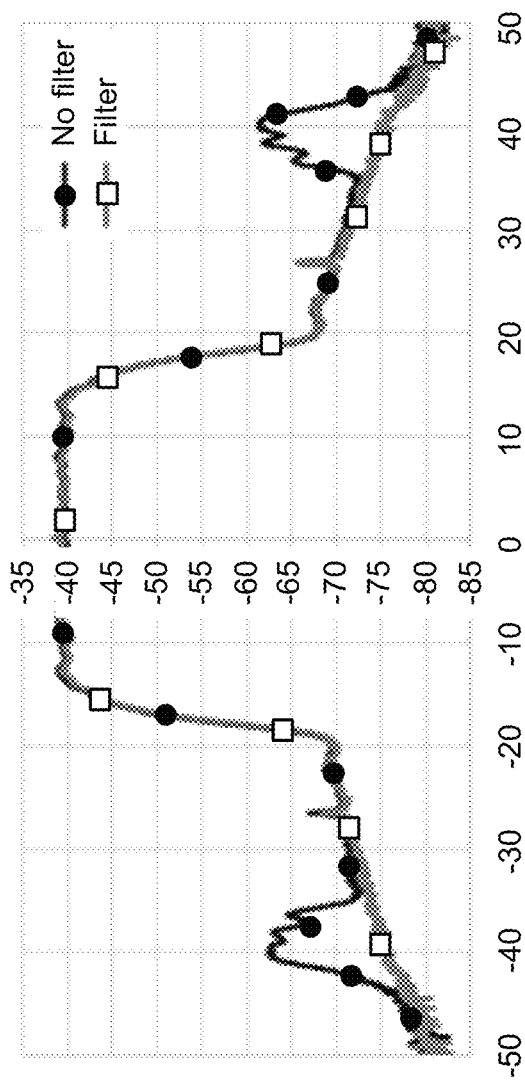
FIG. 5 is a diagram illustrating an example suppression of parasitic lobes provided by a passive RF filter integrated on an RF interconnect, as described herein.

FIG. 5 is a diagram illustrating an example suppression of parasitic lobes provided by a passive RF filter 200 integrated on an RF interconnect 106 of an optical transmitter, as described herein.

In FIG. 5, the line identified as "No filter" corresponds to an intensity of an optical signal relative to a central frequency as provided by an opto-electronic module that does not include the passive RF filter 206 described herein. Conversely, the line identified as "Filter" corresponds to an intensity of an optical signal relative to the central frequency as provided by an opto-electronic module 100 that includes the passive RF filter 206 on the RF interconnect 106, as described herein. As illustrated in FIG. 5, the opto-electronic module 100 including the passive RF filter 206 on the RF interconnect 106 suppresses the side lobes that would be transmitted without the filtering provided by the passive RF filter 206.

As indicated above, FIG. 5 is provided as an example. Other examples may differ from what is described with regard to FIG. 5.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, the term "component" is intended to be broadly construed as hardware, firmware, and/or a combination of hardware and software.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical device, comprising:
   an optical subassembly;
   a digital signal processor (DSP);
   a radio frequency (RF) interconnect that electrically connects the optical subassembly and the DSP via a flexible printed circuit board (FPCB); and a set of passive RF filters on one or more transmission lines of the RF interconnect,
  wherein the set of passive RF filters are configured to control an RF bandwidth such that:
    when the optical subassembly is configured to transmit an optical signal, the passive RF filter is configured to minimize an impact of side lobes resulting from digital modulation on the optical signal, or
    when the optical subassembly is configured to receive an optical signal, the passive RF filter is configured to minimize an impact of neighboring optical channels on an electrical signal generated by the optical subassembly, and
  wherein at least one passive RF filter, of the set of RF filters, includes an open-stab resonator structure.

2. The optical device of claim 1, wherein the optical subassembly is configured to transmit the optical signal, and
  wherein the one or more transmission lines include at least one transmission line associated with the optical signal.

3. The optical device of claim 1, wherein the optical subassembly is configured to receive the optical signal, and
  wherein the one or more transmission lines include at least one transmission line associated with the optical signal.

4. The optical device of claim 1, wherein at least another passive RF filter, of the set of passive RF filters includes a radial stab resonator structure.

5. The optical device of claim 1, wherein at least another passive RF filter, of the set of passive RF filters includes an impedance-variation resonator structure.

6. The optical device of claim 1, wherein the at least one passive RF filter is a stop-band filter.

7. The optical device of claim 1, wherein the at least one passive RF filter is a low-frequency pass filter.

8. The optical device of claim 1, wherein the at least one passive RF filter includes one or more surface-mount technology (SMT) components.

9. The optical device of claim 1, wherein the optical subassembly is a transmitter-receiver optical subassembly (TROSA), a transmitter optical subassembly (TOSA), or a receiver optical subassembly (ROSA).

10. An opto-electronic module, comprising:
  an optical subassembly;
  a digital signal processor (DSP);
  a radio frequency (RF) interconnect connecting the optical subassembly and the DSP via a flexible printed circuit board (FPCB); and
  a set of passive RF filters on a set of transmission lines of the RF interconnect,
    wherein the set of passive RF filters are configured to provide spectrum control of the opto-electronic module such that:
      when the optical subassembly is configured to transmit an optical signal, the passive RF filter is configured to minimize an impact of side lobes resulting from digital modulation on the optical signal, or
      when the optical subassembly is configured to receive an optical signal, the passive RF filter is configured to minimize an impact of neighboring optical channels on an electrical signal generated by the optical subassembly, and
    wherein at least one passive RF filter, of the set of RF filters, includes an open-stab resonator structure.

11. The opto-electronic module of claim 10, wherein optical subassembly is configured to receive the optical signal, and
  wherein at least one passive RF filter, of the set of passive RF filters, is on one or more transmission lines, of the set of transmission lines, that are associated with the optical signal.

12. The opto-electronic module of claim 10, wherein the optical subassembly is configured to transmit the optical signal, and
  wherein at least one passive RF filter, of the set of passive RF filters, is on one or more transmission lines, of the set of transmission lines, that are associated with the optical signal.

13. The opto-electronic module of claim 10, wherein at least another passive RF filter, of the set of passive RF filters, includes:
  a radial stab resonator structure, or
  an impedance-variation resonator structure.

14. The opto-electronic module of claim 10, wherein the optical subassembly is a transmitter-receiver optical subassembly (TROSA), a transmitter optical subassembly (TOSA), or a receiver optical subassembly (ROSA).

15. The opto-electronic module of claim 10, further comprising:
  a mechanical enclosure that houses the optical subassembly, the DSP, the RF interconnect, and the FPCB.

16. A system, comprising:
  an optical device including:
    an optical subassembly;
    a digital signal processor (DSP); and
    a radio frequency (RF) interconnect connecting the optical subassembly and the DSP via a flexible printed circuit board (FPCB), the RF interconnect comprising:
      a set of transmission lines, and
      a set of passive RF filters on one or more transmission lines of the set of transmission lines,
        wherein the set of passive RF filters are configured to control an RF bandwidth such that:
          when the optical subassembly is configured to transmit an optical signal, the passive RF filter is configured to minimize an impact of side lobes resulting from digital modulation on the optical signal, or
          when the optical subassembly is configured to receive an optical signal, the passive RF filter is configured to minimize an impact of neighboring optical channels on an electrical signal generated by the optical subassembly, and
        wherein at least one passive RF filter, of the set of RF filters, includes an open-stab resonator structure.

17. The system of claim 16, wherein,
  when the optical subassembly is configured to receive the optical signal, the one or more transmission lines include a transmission line associated with the optical signal, or
  when the optical subassembly is configured to transmit the optical signal, the one or more transmission lines include a transmission line associated with the optical signal.

18. The system of claim 16, further comprising:
  a housing that houses the optical subassembly, the DSP, the RF interconnect, and the FPCB.

19. The system of claim 16, wherein the at least one passive RF filter includes all passive RF filters of the set of RF filters.

20. The system of claim 16, wherein the at least one passive RF filter includes one or more surface-mount technology (SMT) components.

* * * * *